United States Patent
Park et al.

(10) Patent No.: US 11,442,875 B2
(45) Date of Patent: Sep. 13, 2022

(54) ARBITRATION CONTROL FOR PSEUDOSTATIC RANDOM ACCESS MEMORY DEVICE

(71) Applicant: Integrated Silicon Solution, (Cayman) Inc., Grand Cayman (KY)

(72) Inventors: Geun-Young Park, Milpitas, CA (US); Seong-Jun Jang, San Jose, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 220 days.

(21) Appl. No.: 16/877,006

(22) Filed: May 18, 2020

(65) Prior Publication Data

US 2021/0357335 A1    Nov. 18, 2021

(51) Int. Cl.
| | |
|---|---|
| *G06F 13/16* | (2006.01) |
| *G11C 11/409* | (2006.01) |
| *G11C 11/406* | (2006.01) |
| *H03K 19/20* | (2006.01) |

(52) U.S. Cl.
CPC ........ *G06F 13/1605* (2013.01); *G11C 11/409* (2013.01); *G11C 11/40615* (2013.01); *H03K 19/20* (2013.01)

(58) Field of Classification Search
CPC ............... G06F 13/1605; G11C 11/409; G11C 11/40615; H03K 19/20
See application file for complete search history.

(56) References Cited

U.S. PATENT DOCUMENTS

| | | | |
|---|---|---|---|
| 5,206,830 A | 4/1993 | Isobe | |
| 5,430,681 A | 7/1995 | Sugawara et al. | |
| 6,977,865 B2 | 12/2005 | Jeong | |
| 7,061,828 B2 * | 6/2006 | Takatsuka | G11C 11/40603 |
| | | | 365/233.5 |
| 7,203,116 B2 | 4/2007 | Yahata | |
| 7,982,518 B1 | 7/2011 | Kaczynski | |
| 10,762,945 B2 | 9/2020 | Hou | |
| 2005/0105372 A1 * | 5/2005 | Kanda | G11C 8/08 |
| | | | 365/230.06 |

(Continued)

FOREIGN PATENT DOCUMENTS

TW    I282983 B    6/2007

OTHER PUBLICATIONS

TW Application No. 110110545, Search Report, 5 pages.

*Primary Examiner* — Brian T Misiura (57) ABSTRACT

An arbitration control circuit in a pseudo-static random access memory (PSRAM) device includes a set-reset latch circuit receiving a normal access request signal and a refresh access request signal as first and second input signals and generating a first output signal having zero or more signal transitions in response to the order the first input signal and the second input signal is asserted. The arbitration control circuit further includes a unidirectional delay circuit applying a unidirectional delay to the first output signal and a D-flip-flop circuit latching the first output signal as data in response to the delayed signal as clock. The D-flip-flop generates a second output signal having a first logical state indicative of granting the normal access request and a second logical state indicative of granting the refresh access request to the memory cells of the PSRAM device.

20 Claims, 5 Drawing Sheets

(56) References Cited

U.S. PATENT DOCUMENTS

| | | | |
|---|---|---|---|
| 2005/0146964 A1* | 7/2005 | Sako | G01K 7/00 |
| | | | 374/E7.001 |
| 2005/0162957 A1* | 7/2005 | Oh | G11C 11/4076 |
| | | | 365/222 |
| 2020/0075086 A1* | 3/2020 | Hou | G11C 11/40615 |

* cited by examiner

ARBITRATION CONTROL FOR PSEUDOSTATIC RANDOM ACCESS MEMORY DEVICE

FIELD OF THE INVENTION

The invention relates to control operations of pseudo static random access memory (PSRAM) devices and, in particular, to providing arbitration control in a PSRAM device to suppress and remove metastability during simultaneous external and internal access requests.

BACKGROUND OF THE INVENTION

A pseudostatic random-access memory (PSRAM) is a random-access memory whose internal structure is a dynamic random-access memory (DRAM) with refresh control signals generated internally so that it can mimic the function of a static random-access memory (SRAM). Unlike so-called self-refresh DRAM devices, PSRAM devices have nonmultiplexed address lines and pinouts similar to those of SRAM devices. A PSRAM device incorporates refresh and control circuits on-chip (e.g., refresh address counter and multiplexer, refresh interval timer, arbiter). These circuits allow the PSRAM operating characteristics to closely resemble those of an SRAM. In this manner, a PSRAM device combines the high density of DRAM with the ease of use of a true SRAM.

PSRAM is distinguishable from DRAMs with "self-refresh mode" where the self-refresh mode is primarily used in standby mode to allow a host system to suspend operation of an external DRAM controller to save power without losing data stored in DRAM. The self-refresh mode refreshes the DRAM data during the standby mode when no control signals are received from the external DRAM controller. The PSRAM device does not require an external DRAM controller in operation and includes build-in refresh control to allow the PSRAM to behave as an SRAM.

In operation, the PSRAM device performs read and write operations responsive to read/write requests received external to the PSRAM and performs memory cell refresh in between the read or write operation. The PSRAM devices includes a counter to generate the internal refresh request. As a result, the read/write requests and the refresh request operate on different frequency domains. As a result, there may be collisions between the read/write requests and refresh requests when the external read/write request arrives at the same time the internal refresh request is issued.

BRIEF DESCRIPTION OF THE DRAWINGS

Various embodiments of the invention are disclosed in the following detailed description and the accompanying drawings.

DETAILED DESCRIPTION

In embodiments of the present disclosure, an arbitration control circuit in a pseudo-static random access memory (PSRAM) device incorporates a metastability control filter connected in series to the output of an SR latch circuit receiving the normal (read/write) and refresh access request signals. The arbitration control circuit generates access grant signals to grant access to either the normal (read/write) request or the refresh request. The arbitration control circuit operates to suppress and remove metastability risks which can cause PSRAM operation failure when the external read/write access request and the internal refresh access request are asserted simultaneously. In some embodiments, the metastability control filter of the arbitration control circuit includes a unidirectional delay circuit for removing unwanted short glitches in the SR latch circuit output signal and a D-flip-flop circuit acting as a second arbiter to the SR latch circuit acting as the first arbiter. By using two serially connected arbiters, the probability of metastability in the PSRAM device is reduced by orders of magnitude. In some embodiments, the delay introduced by the unidirectional delay circuit is tunable to achieve the desired resolution time and targeted mean time between failure (MTBF) requirement for the PSRAM device.

In some embodiments, a refresh timer circuit is coupled to the D-flip-flop circuit to reset the refresh access grant signal after a given duration. In this manner, the arbitration control circuit ensures the refresh access grant signal has a minimum duration to guarantee stable refresh operation.

Figure 1:
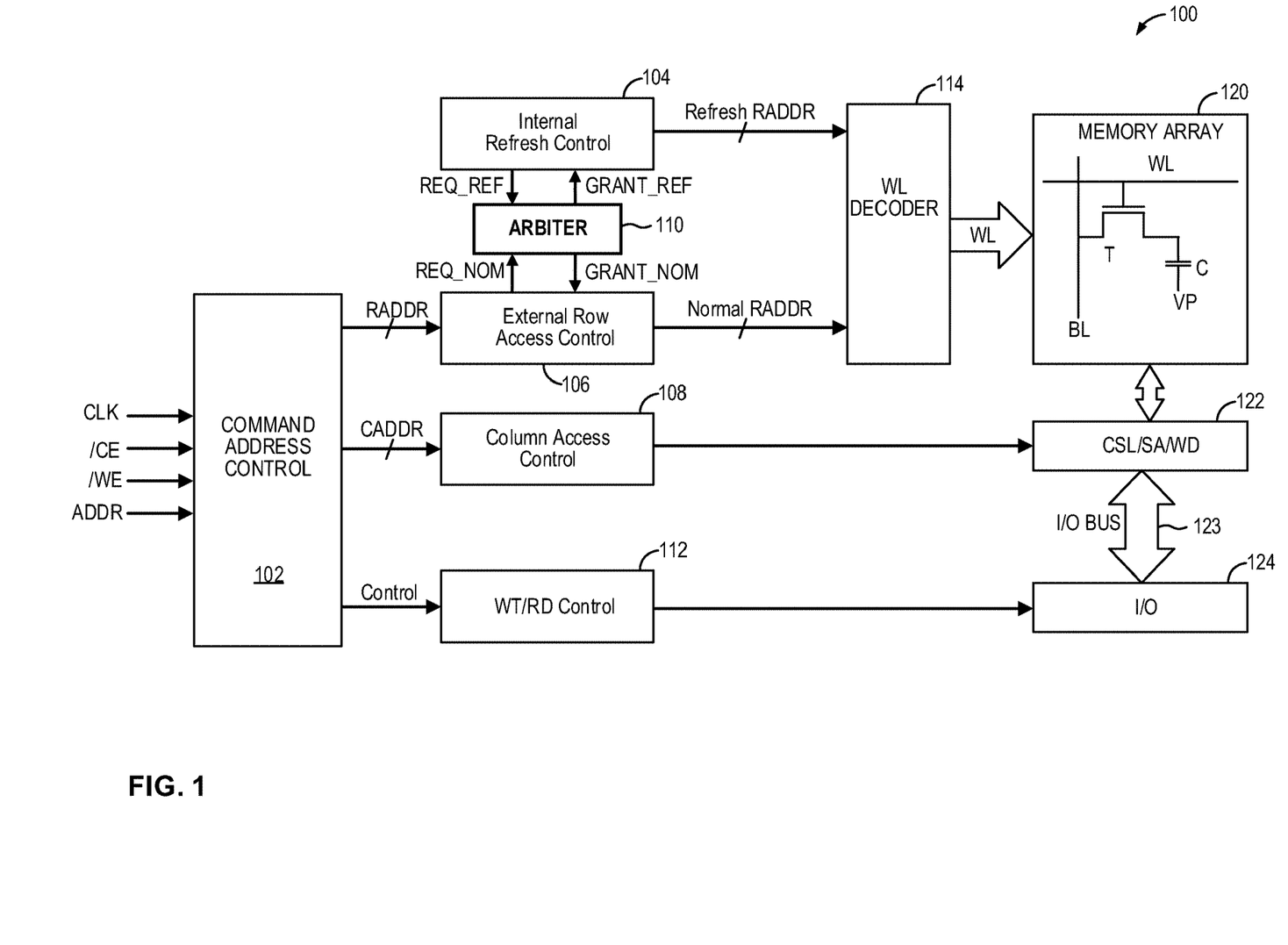
FIG. 1 is a schematic diagram illustrating a PSRAM device in embodiments of the present disclosure.

FIG. 1 is a schematic diagram illustrating a PSRAM device in embodiments of the present disclosure. As described above, a pseudostatic random-access memory (PSRAM) is a random-access memory including DRAM type memory cells and built-in refresh control to mimic the function of a static random-access memory (SRAM). Referring to FIG. 1, a PSRAM device 100 includes a memory array 120 of dynamic memory cells. Each dynamic memory cell includes a single access transistor T connected to a storage capacitor C. The memory array is organized as a two-dimensional array and each dynamic memory cell is accessed by a word line WL and a bit line BL.

The PSRAM device 100 includes a command and address control circuit 102 to receive the input control signals, including the clock signal, the chip select signal CE, the write enable signal WE and the memory cell address ADDR. An input/output (I/O) circuit 124 receives and provides memory data. That is, the memory data to be written into the memory cells is provided to I/O circuit 124 and the memory data to be read out from the memory cells are provided as output signals on I/O circuit 124.

The PSRAM device 100 receives the write enable signal WE to indicate a write operation or a read operation is to be performed at the input address ADDR. In the present example, the write enable signal WE is an active low signal (denoted as /WE). The write enable signal /WE is asserted to a logical high to initiate a read operation and is asserted to a logical low to initiate a write operation. The command and address control circuit 102 generates a control signal Control which is provided to a Write and Read control circuit 112. The Write and Read control circuit 112 generate control signals to control the I/O circuit 124 to either receive incoming memory write data or to provide outgoing memory read out data.

The command and address control circuit 102 decode the input address ADDR and generates a row address RADDR for addressing the word lines WL and column address CADDR for addressing the bit lines. The column address CADDR is provided to a column access control circuit 108 which is coupled to control the column select/sense amplifier/write driver circuit 122. The column address CADDR is used to activate a selected column. For read operation, the bit lines for the selected column is pre-charged and the sense amplifier read out memory data from the selected memory cells and the read out memory is provided to the I/O circuit 124 through the I/O bus 123. For write operation, the write driver drives the bit lines for the selected column to the write data received from I/O circuit 124 and passed to the write driver on I/O bus 123.

Meanwhile the row address RADDR is provided to an external row access control circuit 106. The external row access control circuit 106 generates a normal access request REQ_NOM in response to a row address RADDR being received from the command and address control circuit 102. In the present description, read or write operation to the PSRAM device 100 is referred to as external request or external access or external access request as the read and write operations are initiated outside of the PSRAM device. In the present description, the external access request to the PSRAM device 100 is also referred to as normal access request or normal request to signify access requests that are made for normal PSRAM operations—that is, read and write operations.

The PSRAM device includes built-in refresh circuit to perform the refresh operation of the dynamic memory cells in the memory array 120. In the present description, the built-in refresh operation is referred to as internal request or internal access or internal access request as the refresh operations are initiated inside of the PSRAM device. In the present description, the internal access request in the PSRAM device 100 is also referred to as refresh access request or refresh request to signify access requests that are made for the memory cell refresh operations. To that end, the PSRAM device 100 includes an internal refresh control circuit 104 to generate an internal refresh access request REQ_REF for initiating a refresh operation of the memory array 120. For example, the internal refresh control circuit 104 may include a counter or a timer circuit which is configured to generate a refresh access request REQ_REF in response to the counter reaching a certain value or a given time duration has transpired.

The normal access request REQ_NOM and the refresh access request REQ_REF are signals operating on different frequency domains. That is, the normal access request REQ_NOM and the refresh access request REQ_REF are not operated on the same clock frequency or related clock frequencies. Therefore, the normal access request REQ_NOM and the refresh access request REQ_REF sometimes experiences collision when both requests want to access the word line at the same time. In operation, only one request (normal or refresh) can access the word line. Accordingly, the normal access request signal REQ_NOM and the refresh access request signal REQ_REF are coupled to an arbiter circuit 110 which operates to determine which access request should be granted.

When the external access request is to be granted, the arbiter 110 asserts the normal access grant signal GRANT_NOM which is provided to the external row access control circuit 106. The external row access control circuit 106 in response generates a normal row address ("Normal RADDR") which is provided to a word line decoder 114. When the refresh access request is to be granted, the arbiter 110 asserts the refresh access grant signal GRANT_REF which is provided to the internal refresh control circuit 104. The internal refresh control circuit 104 in response generates a refresh row address ("Refresh RADDR") which is provided to the word line decoder 114. The word line decoder 114 decodes the row address (either refresh row address or normal row address) and activates the selected word line signal in the memory array 120 for the respective read, write or refresh operation.

In digital circuit designs, different clock frequencies are often used within a circuit and the different clock frequencies must be synchronized. However, any kind of synchronization will inevitably lead to metastability failures and the metastability failures tend to increase as clock frequency increases, especially for high performance and low power design trends. In the PSRAM device 100 of FIG. 1, the arbiter 110 is configured to arbitrate the external access request and the internal access request to ensure stable and reliable performance of the PSRAM device. In embodiments of the present disclosure, the arbiter 110, also referred to as an arbitration control circuit in the present disclosure, incorporates a metastability control filter connected in series to the output of an SR latch circuit receiving the normal and refresh access request signals. As thus configured, the arbiter 110 suppresses and removes metastability risks in PSRAM device 100. Furthermore, the metastability control filter in the arbiter 110 is tunable to enable the PSRAM device to achieve the targeted Mean Time Between Failure (MTBF) while providing clean access grant signals to the respective row address control circuits. The arbiter 110 of the present disclosure minimizes speed loss by minimizing the clock out time while the additional arbiter circuit in the metastability control filter reduces the probability of the metastability risk by orders of magnitude. The details of the metastability control filter will be described in more details below.

Figure 2:
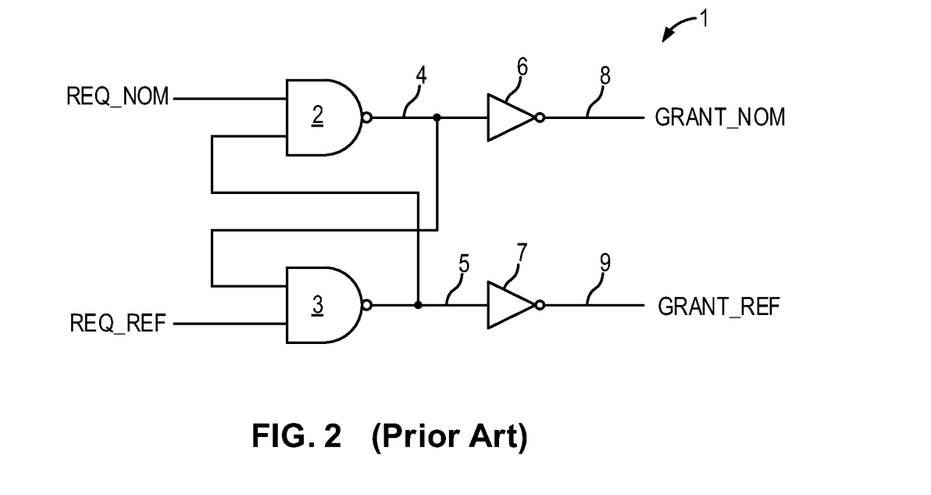
FIG. 2 is a circuit diagram illustrating a conventional arbiter circuit that can be used in a conventional PSRAM in some examples.

FIG. 2 is a circuit diagram illustrating a conventional arbiter circuit that can be used in a conventional PSRAM in some examples. Referring to FIG. 2, a conventional method for arbitrating incoming commands from external request and internal request simultaneously is to use a set-reset latch circuit, such as a NAND latch circuit or a NOR latch circuit. FIG. 2 illustrates an arbiter circuit 1 implemented as an NAND latch circuit using a pair of cross-coupled NAND logic gates 2 and 3. To arbitrate between the normal access request signal REQ_NOM and the refresh access request signal REQ_REF, the NAND logic gate 2 receives the normal access request signal REQ_NOM and the output signal (node 5) of NAND logic gate 3, and the NAND logic gate 3 receives the refresh access request signal REQ_REF and the output signal of NAND logic gate 2 (node 4). The normal access grant signal GRANT_NOM (node 8) is the inverse of the output signal (node 4) of the NAND logic gate 2, such as inverted by inverter 6. The refresh access grant signal GRANT_REF (node 9) is the inverse of the output signal (node 5) of the NAND logic gate 3, such as inverted by inverter 7.

Figure 3:
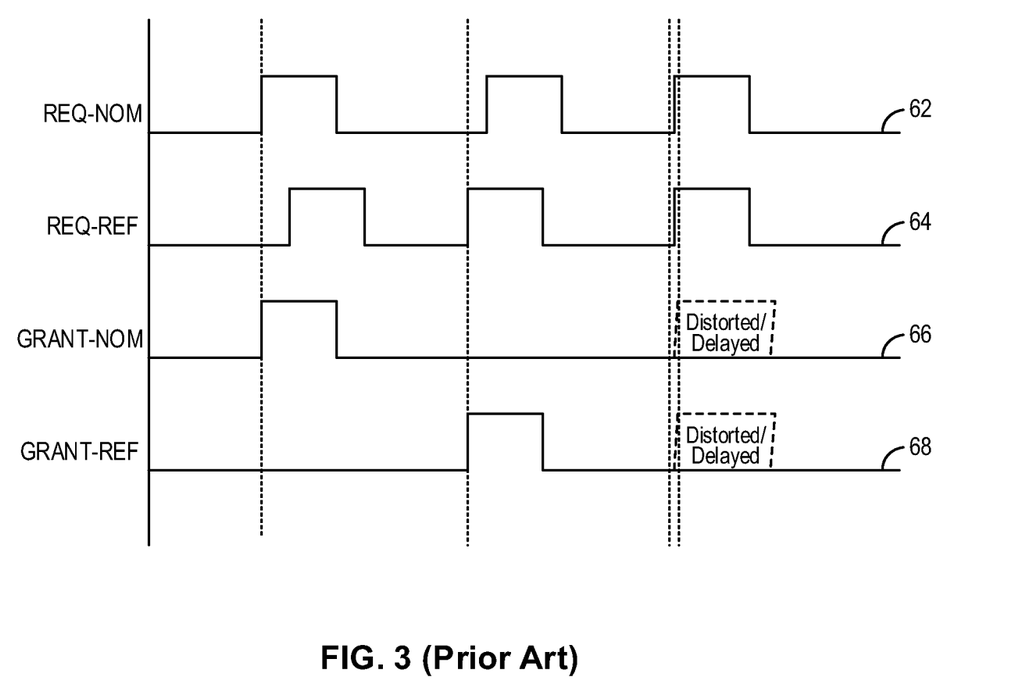
FIG. 3 is a timing diagram illustrating the operation of the conventional arbiter circuit of FIG. 2 in some examples.

FIG. 3 is a timing diagram illustrating the operation of the conventional arbiter circuit of FIG. 2 in some examples. The normal access request signal REQ_NOM and the refresh access request signal REQ_REF are two command signals belonging to different frequency domains. When signal REQ_NOM (curve 62) come earlier than signal REQ_REF (curve 64), the arbiter circuit 1 grants access to the normal access request and asserts the signal GRANT_NOM (curve 66). Meanwhile, when the signal REQ_REF comes earlier than the signal REQ_NOM, the arbiter circuit 1 grants access to the refresh access request and asserts the signal GRANT_REF (curve 68). However, when both command signals REQ_NOM and REQ_REF arrive almost simultaneously within a metastability window, the arbiter circuit 1 may be delayed in generating the access grant signal or the resulting access grant signal may be distorted. For instance, the access grant signal may become corrupted with irregular waveform or with shortened pulse width. The amount of delay or distortion is a matter of the probability of the command signal collision. The closer in time the two commands arrive, the lower the probability of occurrence but it can be translated into longer resolution time. That is, when the two command signals arrive very close together, it will take longer for the arbiter circuit 1 to determine which command to grant access to.

Figure 6:
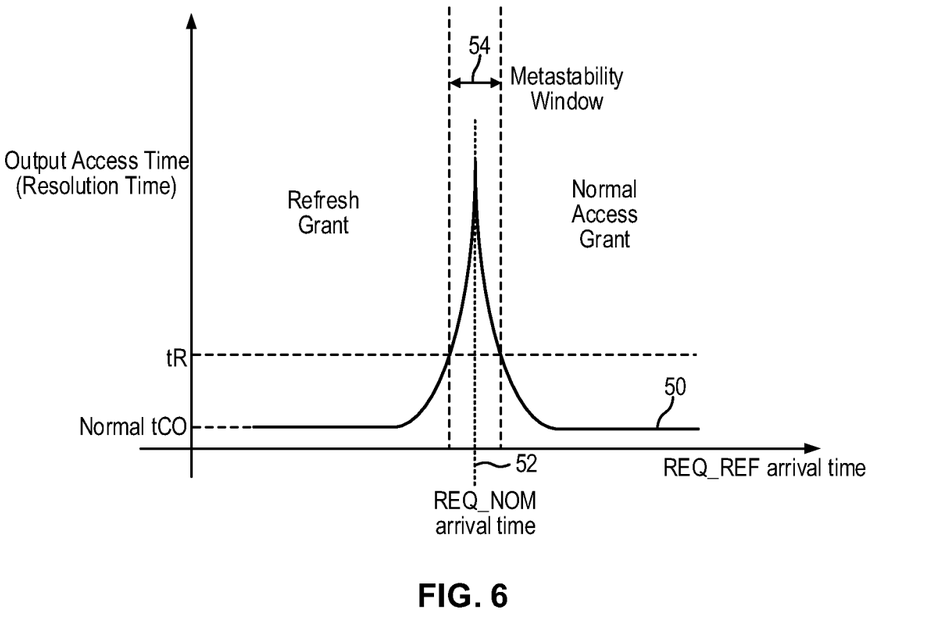
FIG. 6 is a plot of the output access time versus the refresh request arrival time for the conventional arbiter circuit in some examples.

Due to the nature of the two independent command signals belonging to different frequency domains, the rare probability that the normal access request will transition within the metastability window is often described by the equation for Mean Time Between Failure (MTBF). In the present description, the metastability window refers to the time window in which two command signals arrives within each other. In general, this probability is quite rare from fail detection point of view, but the probability may be quite often from user point of view if assuming MTBF is 1 year or so. In particular, the Mean Time Between Failure may be given as:

$$MTBF = \frac{e^{t/\tau}}{T_w f_c f_r},$$

where: $T_w$: Meta window
$f_c$: clock frequency
$f_r$: Refresh frequency
t: resoution time
$\tau$: time constant for resoution If the MTBF for a synchronized system is not at an acceptable level, the system would fail. This is especially problematic for PSRAM devices, because of the dynamic memory cell's destructive reading nature. FIG. 6 is a plot of the output access time versus the refresh request arrival time for the conventional arbiter circuit in some examples. Referring to FIG. 6, the arbitrating operation is essentially the comparison of the normal access request signal and the refresh access request signal provided by the external system and the internal circuit operation. In FIG. 6, the normal access request signal REQ_NOM is assumed to have an arrival time denoted by line 52 and the x-axis represent the arrival time for the refresh access request signal REQ_REF. The metastability window 54 is a time period when the two signal arrive within a given time of each other. The curve 50 depicts the output access time, also referred to as the resolution time, of the arbiter circuit. With the metastability window, the clock frequency, the refresh frequency, and the time constant determined, the resolution time is log scale of the MTBF. Simply speaking, selecting lower resolution time threshold tR in the system would invite more system level failures. As shown in FIG. 6, the conventional arbiter circuit 1 can generate access grant signals within the normal clock out time tCO in most case regardless of request signal sequences. However, the output access time increases exponentially as the refresh access request signal REQ_REF get closer to the normal access request signal REQ_NOM, although with lower probability of occurrence. Within the metastability window, the resolution time becomes very high, greater than the desired resolution time threshold tR for the PSRAM device.

Figure 4:
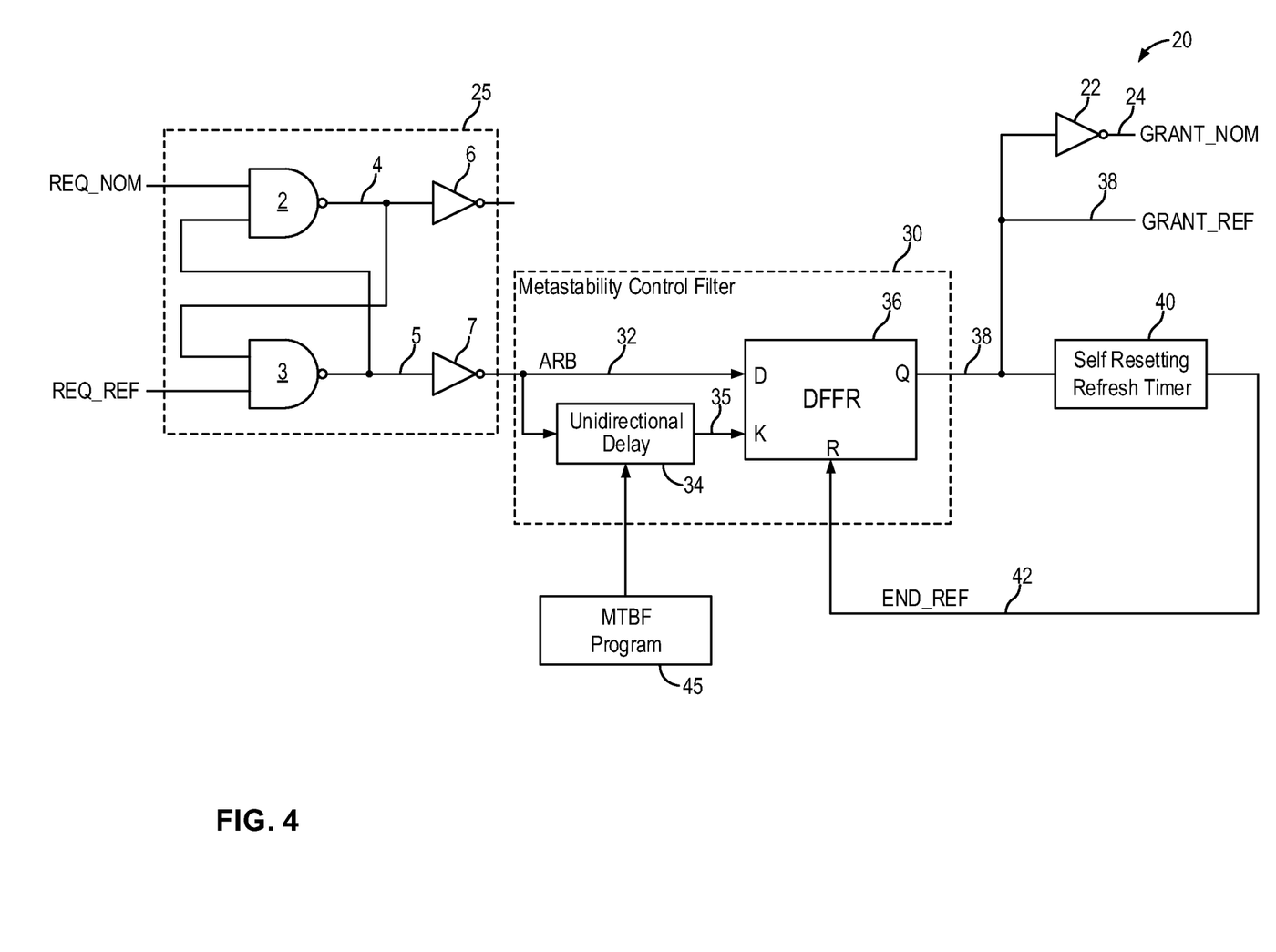
FIG. 4 is a schematic diagram illustrating an arbiter circuit which can be incorporated in a PSRAM device in embodiments of the present disclosure.

FIG. 4 is a schematic diagram illustrating an arbiter circuit which can be incorporated in a PSRAM device in embodiments of the present disclosure. In some embodiments, the arbiter circuit 20 of FIG. 4 can be used to implement the arbiter 110 in the PSRAM device 100 of FIG. 1. Referring to FIG. 4, the arbiter circuit 20, also referred to as an arbitration control circuit, is configured to arbitrate the normal access request signal and the refresh access request signal in a PSRAM device, such as the PSRAM device 100 of FIG. 1. The arbiter circuit 20 receives the normal access request signal REQ_NOM as a first input signal indicative of a command signal received from a host system external to the PSRAM device to initiate a read or a write operation to the PSRAM device. The arbiter circuit 20 also receives the refresh access request signal REQ_REF as a second input signal indicative of a command signal received from the internal refresh control circuit of the PSRAM device for initiating a refresh operation in the PSRAM device.

The arbiter circuit 20 includes a first arbiter 25 formed as a set-reset latch circuit. In the present embodiment, the set-reset latch circuit is implemented as an NAND latch circuit including a pair of cross-coupled NAND gates 2, 3 and accompanying inverters 6, 7. More specifically, the NAND logic gate 2 receives the normal access request signal REQ_NOM and the output signal (node 5) of NAND logic gate 3, and the NAND logic gate 3 receives the refresh access request signal REQ_REF and the output signal of NAND logic gate 2 (node 4). The first arbiter 25 provides an arbitrated signal ARB (node 32) taken from the output signal of NAND logic gate 3 and inverted by inverter 7. In the present embodiment, the output signal from NAND logic gate 2 is not used and the inverter 6 at the output terminal (node 4) of the NAND logic gate 2 is a dummy gate included to provide a balanced load between NAND gates 2 and 3. The inverter 6 may be omitted in other embodiments of the present disclosure.

The first arbiter 25 arbitrates between the normal access request signal REQ_NOM and the refresh access request signal REQ_REF and generates the arbitrated signal ARB as an output signal on output node 32. The arbitrated signal ARB has no signal transition in response to the normal access request signal arriving before the refresh access request signal. The arbitrated signal ARB is a signal pulse in response to the normal access request signal arriving after the refresh access request signal. However, when the normal access request signal arriving very close to the refresh access request signal, either before or after the refresh access request signal, the arbitrated signal ARB may have a distorted or corrupted waveform with two or more signal transitions.

The arbiter circuit 20 includes a metastability control filter 30 coupled in series to the first arbiter 25. In particular, the metastability control filter 30 is connected to the output node 32 of the first arbiter to receive the arbitrated signal ARB and generates the refresh access grant signal GRANT_REF (node 38). The normal access grant signal GRANT_NOM (node 24) is the inverse of the refresh access grant signal GRANT_REF, and can be generated using an inverter 22 coupled to the signal GRANT_REF.

The metastability control filter 30 includes a unidirectional delay circuit 34 coupled to receive the arbitrated signal ARB. The unidirectional delay circuit 34 has the function of removing short glitches in the arbitrated signal ARB. In particular, the unidirectional delay circuit 34 applies a delay to the leading signal transition of the arbitrated signal ARB and no delay to the trailing signal transition to generate a delay signal on an output node 35. In the case the arbitrated signal ARB has no signal transition, the delayed signal also has no signal transition. When the arbitrated signal ARB has a pulse width that is shorter than the delay introduced by the unidirectional delay circuit, the delayed leading signal transition occurs after the trailing signal transition and the delayed signal has no signal transition. In this manner, the unidirectional delay circuit 34 remove arbitrated signal ARB that is just a short glitch or that has a short pulse width. Only when the arbitrated signal ARB has a pulse width greater than the delay will the signal ARB be passed through the unidirectional delay circuit 34. In some embodiment, the delay provided by the unidirectional delay circuit 34 is tunable or programmable. For instance, the delay of the unidirectional delay circuit 34 may be programmed to a value based on the requirement for the MTBF for the PSRAM device. In FIG. 4, a MTBF program circuit 45 is shown coupled to the unidirectional delay circuit 34 to program the delay value. The MTBF program circuit 45 is illustrative only and other circuits and methods to tune or program the delay value in the unidirectional delay circuit 34 can be used.

The metastability control filter 30 further includes a second arbiter 36 constructed as a D-flip-flop. The D-flip-flop 36 receives the non-delayed arbitrated signal ARB (node 32) as the data input signal D and the delayed signal (node 35) as the clock signal K and provides a data output signal Q (node 38). The D-flip-flop 36 passes the data input signal D (i.e. the non-delayed arbitrated signal ARB) to the data output signal Q in response to the delayed signal as the clock signal. Accordingly, an arbitrated signal ARB having a short pulse width would be rejected at the D-flip-flop as there would not be a clock signal K. An arbitrated signal ARB having a sufficiently long pulse width would pass through the D-flip-flop as clocked by the clock signal K.

As thus constructed, the metastability control filter 30 provides glitch removal function and a second arbiter in series with the first arbiter 25. The probability of metastability of two series connected arbiters with delay is reduced dramatically. Even though there is still a chance for metastability mathematically, the probability is reduced by a few orders of magnitude below the conventional scheme using a single NAND latch as the arbiter.

The metastability control filter 30 generates an output signal (node 38) which is provided as the refresh access grant signal GRANT_REF. The normal access grant signal GRANT_NOM is the inverse of the refresh access grant signal GRANT_REF. The inverter 22 can be used to invert the refresh access grant signal GRANT_REF to generate the normal access grant signal GRANT_NOM (node 24). In the present embodiment, the refresh access grant signal GRANT_REF and the normal access grant signal GRANT_NOM are complementary signal. In operation, the normal access grant signal GRANT_NOM is asserted normally and the normal access grant signal GRANT_NOM is deasserted when the refresh access grant signal GRANT_REF is to be asserted.

In embodiments of the present disclosure, the arbiter circuit 20 may further include a refresh timer circuit 40. The refresh timer circuit 40 implements self-resetting function for the refresh operation. In particular, the refresh timer circuit 40 is triggered by the output signal of the metastability control filter 30, or the data output signal Q of the D-flip-flop 36. The refresh timer circuit 40 generates an end refresh signal END_REF (node 42) which is coupled to the reset terminal of the D-flip-flop 36. Accordingly, in response to the refresh access grant signal GRANT_REF being asserted, the refresh timer circuit 40 is triggered and asserts the end refresh signal END_REF after a given time duration. The D-flip-flop 36 resets the refresh access grant signal GRANT_REF (or the data output signal 38) and the refresh operation is terminated. By using the refresh timer circuit 40, the arbiter circuit 20 ensures a stable refresh operation by ensuring that the refresh access grant signal GRANT_REF is asserted for a sufficient time duration to complete the refresh operation.

Figure 5:
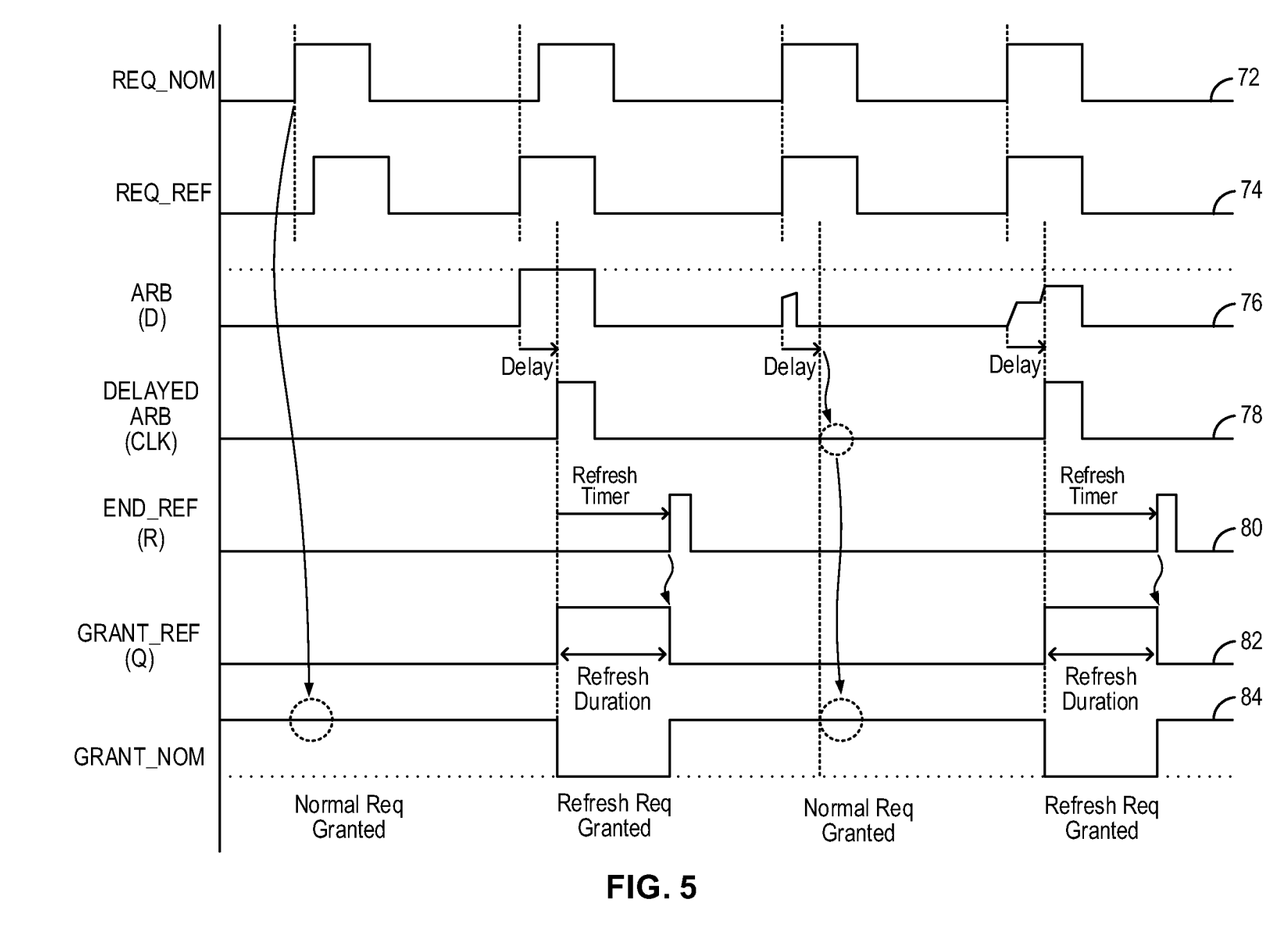
FIG. 5 is a timing diagram illustrating the operation of the arbiter circuit of FIG. 4 in a PSRAM device in embodiments of the present disclosure.

FIG. 5 is a timing diagram illustrating the operation of the arbiter circuit of FIG. 4 in a PSRAM device in embodiments of the present disclosure. Referring to FIG. 5, the normal access request signal REQ_NOM (curve 72) and the refresh access request signal REQ_REF (curve 74) belong to different frequency domains and may arrive before or after the other signal. When signal REQ_NOM (curve 72) come earlier than signal REQ_REF (curve 74), the first arbiter circuit 25 generates an arbitrated signal ARB (curve 76) having no signal transition. The delay signal (curve 78) also has no signal transition and the metastability control filter 30 generates a refresh access grant signal GRANT_REF (curve 82) at a logical low state (deasserted). The normal access grant signal GRANT_NOM (curve 84) is at a logical high state (asserted) and the arbiter circuit 20 grants access to the normal access request.

On the other hand, when the refresh access request signal REQ_REF comes earlier than the normal access request signal REQ_NOM, the first arbiter circuit 25 generates the arbitrated signal ARB with a pulse in response to the refresh access request signal REQ_REF. The unidirectional delay circuit 34 of the metastability control filter 30 applies a delay to the leading edge of the pulse and no delay to the trailing edge of the pulse. As a result, at the leading edge of the delayed signal, the D-flip-flop 36 clocks in the arbitrated signal ARB to the data output signal Q. The refresh access grant signal GRANT_REF is thus asserted (logical high) and the normal access grant signal GRANT_NOM is deasserted (logical low). At the leading edge of the refresh access grant signal GRANT_REF, the refresh duration at the refresh timer circuit 40 is triggered. At the end of the refresh duration, the end refresh signal END_REF (curve 80) is asserted and the refresh access grant signal GRANT_REF is deasserted, with the normal access grant signal GRANT_NOM being asserted.

In some cases, the command signals REQ_NOM and REQ_REF may arrive almost simultaneously or within a close timing window of each other. In that case, the first arbiter circuit 25 may generate an arbitrated signal ARB that is corrupted or has shortened pulse width. For example, the first arbiter circuit 25 may generate a short glitch as the arbitrated signal ARB. The short glitch ARB signal would be undesirable to use as the refresh access grant signal because the short glitch may not provide sufficient time for the refresh operation and thus may lead to PSRAM device failure because the dynamic memory cells are not refreshed as needed. PSRAM device includes DRAM memory cell structure which requires fixed amount of time to write, read and refresh correctly. The refresh operation is important because of the destructive nature of reading from the DRAM memory cells. Therefore, a short glitch in the refresh access grant signal is not desired as it may lead to insufficient refresh of the PSRAM memory cells. Therefore, removing short glitch waveforms from the PSRAM operation is critical to the reliability and performance of the PSRAM device.

Accordingly, in embodiments of the present disclosure, the metastability control filter 30 removes the short glitch ARB signal using the unidirectional delay circuit 34. In particular, the leading edge of the short glitch ARB signal is delayed and when the delayed edge goes past the trailing edge, the unidirectional delay circuit 34 would remove the signal and no signal transitions appears on the delayed signal. With no clock signal at the D-flip-flop 36, the refresh access grant signal GRANT_REF remains at a logical low (deasserted) while the normal access grant signal GRANT_NOM remains at a logical high (asserted). No PSRAM refresh operation is initiated.

In another example, when the command signals REQ_NOM and REQ_REF may arrive almost simultaneously, the first arbiter circuit 25 may generate an arbitrated signal ARB with distorted delay. The distorted delay signal could be a problem for high speed applications, although it may be acceptable for non-speed critical application. In any case, the unidirectional delay circuit 34 of the metastability control filter 30 applies a delay to the leading edge of the arbitrated signal ARB and no delay to the trailing edge of the arbitrated signal ARB. The unidirectional delay circuit 34 also restores the magnitude of the arbitrated signal ARB to generate the delay signal with a delayed leading edge and a restored waveform. The delayed signal is used as the clock signal to clock in the arbitrated signal ARB. As a result, at the leading edge of the delayed signal, the D-flip-flop 36 clocks in the arbitrated signal ARB to the data output signal Q. The refresh access grant signal GRANT_REF is thus asserted (logical high) and the normal access grant signal GRANT_NOM is deasserted (logical low). At the leading edge of the refresh access grant signal GRANT_REF, the refresh duration at the refresh timer circuit 40 is triggered. At the end of the refresh duration, the end refresh signal END_REF is asserted and the refresh access grant signal GRANT_REF is deasserted, with the normal access grant signal GRANT_NOM being asserted.

Figure 7:
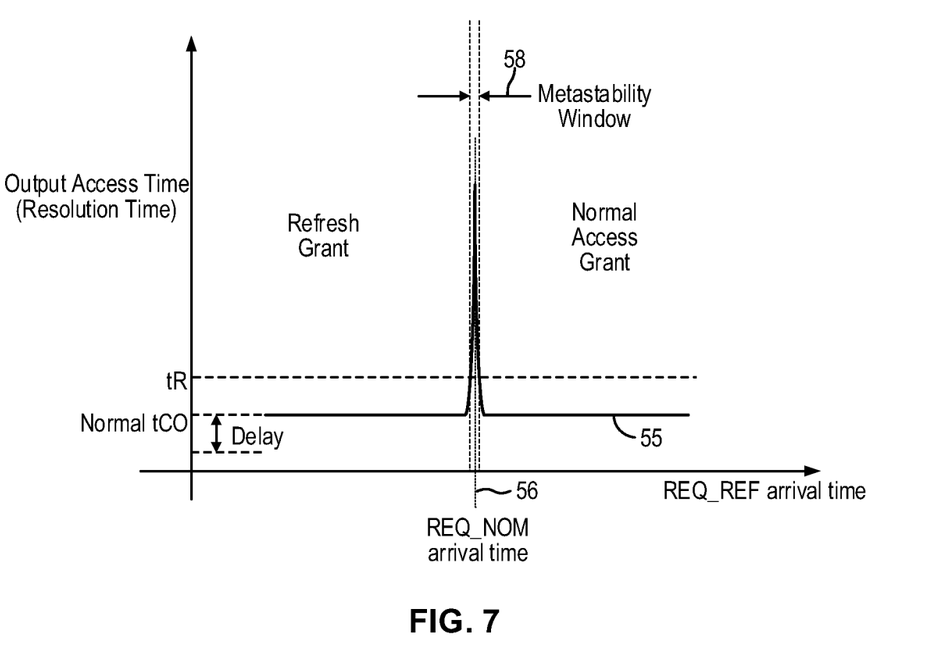
FIG. 7 is a plot of the output access time versus the refresh request arrival time for the arbiter circuit of FIG. 4 in embodiments of the present disclosure.

The resolution time and metastability windows versus refresh access request time comparison between the conventional arbiter and the arbiter circuit of the present disclosure are shown in FIGS. 6 and 7 respectively. As discussed above, FIG. 6 is a plot of the output access time versus the refresh request arrival time for the conventional arbiter circuit in some examples. FIG. 7 is a plot of the output access time versus the refresh request arrival time for the arbiter circuit of FIG. 4 in embodiments of the present disclosure.

Referring to FIG. 6, the conventional arbiter has resolution time tR which is determined by system performance and associated metastability window. The metastability window 54 is large in the conventional case. Referring to FIG. 7, the normal access request signal REQ_NOM is assumed to have an arrival time denoted by line 56 and the x-axis represent the arrival time for the refresh access request signal REQ_REF. The metastability window 58 is a time period when the two signal arrive within a given time of each other. The curve 55 depicts the output access time, also referred to as the resolution time, of the arbiter circuit. The arbiter circuit of the present disclosure is able to reduce the metastability window 58 to be very narrow. Although the glitch removal using the unidirectional delay increases the normal clock out time tCO by the delay amount, the increased in normal clock out time tCO can be tolerated since the reduction in the metastability window 58 is on a few orders of magnitude. In particular, the use of first and second arbiters in the arbiter circuit of the present disclosure tightens the metastability window so that the chance for arbitration failure is rare and the MTBF is improved by a few orders of magnitude.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided above along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The above detailed descriptions are provided to illustrate specific embodiments of the present invention and are not intended to be limiting. Numerous modifications and variations within the scope of the present invention are possible. The present invention is defined by the appended claims.

What is claimed is:

1. An arbitration control circuit in a pseudo-static random access memory (PSRAM) device, the arbitration control circuit comprising:
   a set-reset (SR) latch circuit receiving a first input signal being a normal access request signal indicative of a read or write access request to memory cells of the PSRAM device, and a second input signal being a refresh access request signal indicative of a refresh access request to memory cells of the PSRAM device, the SR latch circuit generating a first output signal in response to a logical operation of the first input signal and the second input signal, the first output signal having no signal transition in response to the first input signal being asserted before the second input signal being asserted, or having two or more signal transitions in response to the first input signal being asserted after or simultaneously with the second input signal being asserted;
   a unidirectional delay circuit having an input terminal receiving the first output signal and introducing a first delay to a leading signal transition of the first output signal to generate a delayed signal on an output terminal, the delayed signal having no signal transition in response to the first output signal having no signal transition or having a pulse width shorter than the first delay; and
   a D-flip-flop circuit having a data input terminal receiving the first output signal, a clock input terminal receiving the delayed signal, a reset input terminal receiving a reset signal, and an output terminal providing a second output signal, the second output signal having a first logical state in response to the delayed signal having no signal transition and having a second logical state in response to a signal transition in the delayed signal, the second output signal remaining in the second logical state until the reset signal is asserted to reset the second output signal to the first logical state, wherein the second output signal has a first logical state indicative of granting the read or write access request and a second logical state indicative of granting the refresh access request to the memory cells of the PSRAM device.

2. The arbitration control circuit of claim 1, wherein the unidirectional delay circuit generates the delayed signal having a leading signal transition being the leading signal transition of the first output signal delayed by the first delay and a trailing signal transition being the trailing signal transition of the first output signal without delay.

3. The arbitration control circuit of claim 2, wherein the delayed signal has no signal transition in response to the leading signal transition of the delayed signal occurring after the trailing signal transition of the delay signal.

4. The arbitration control circuit of claim 2, wherein the leading signal transition of the delayed signal comprises a rising edge and the trailing signal transition of the delayed signal comprises a falling edge.

5. The arbitration control circuit of claim 1, wherein the first delay is programmable to realize a predetermined resolution time of the PSRAM device.

6. The arbitration control circuit of claim 1, further comprising:
a refresh timer circuit having an input terminal receiving the second output signal and an output terminal providing the reset signal to the D-flip-flop circuit, wherein the refresh timer circuit asserts the reset signal a first time duration after a leading signal transition is detected on the second output signal, wherein the reset signal is coupled to the reset terminal of the D-flip-flop to reset the second output signal to the first logical state.

7. The arbitration control circuit of claim 6, wherein the first time duration comprises a time duration to complete a refresh operation of the memory cells in the PSRAM device.

8. The arbitration control circuit of claim 1, wherein the second output signal is provided as a refresh access grant signal coupled to a refresh control circuit to grant the refresh control circuit access to the memory cells of the PSRAM device for refresh operation, and an inverse of the second output signal is provided as a normal access grant signal coupled to a normal control circuit to grant the normal control circuit access to the memory cells of the PSRAM device for read or write operation.

9. The arbitration control circuit of claim 1, wherein the SR latch circuit comprises an NAND latch circuit comprising:
a first NAND logic gate connected in series with a first inverter, the first NAND logic gate having a first input terminal receiving the first input signal being the normal access request signal, a second input terminal, and an output terminal coupled to the first inverter; and
a second NAND logic gate connected in series with a second inverter, the second NAND logic gate having a first input terminal receiving the second input signal being the refresh access request signal, a second input terminal, and an output terminal coupled to the second inverter,
wherein the second input terminal of the first NAND logic gate is coupled to the output terminal of the second NAND logic gate; and the second input terminal of the second NAND logic gate is coupled to the output terminal of the first NAND logic gate; and wherein the second inverter provides the first output signal.

10. The arbitration control circuit of claim 1, wherein the normal access request signal indicative of the read or write access request to memory cells of the PSRAM device is derived from a signal external to the PSRAM device, and the refresh access request signal indicative of the refresh access request to memory cells of the PSRAM device is a signal generated within the PSRAM device.

11. A method in a pseudo-static random access memory (PSRAM) device for providing arbitration control, the method comprising:
receiving a first input signal being a normal access request signal indicative of read or write access request to memory cells of the PSRAM device;
receiving a second input signal being a refresh access request signal indicative of refresh access request to memory cells of the PSRAM device;
generating a first output signal in response to a logical operation of the first input signal and the second input signal, the first output signal having no signal transition in response to the first input signal being asserted before the second input signal being asserted, or having two or more signal transitions in response to the first input signal being asserted after or simultaneously with the second input signal being asserted;
generating a delayed signal having a leading signal transition being a first delay after a leading signal transition of the first output signal, the delayed signal having no signal transition in response to the first output signal having a pulse width shorter than the first delay;
generating a second output signal having a first logical state in response to the delayed signal having no signal transition and having a second logical state in response to a signal transition in the delayed signal, the second output signal remaining in the second logical state until being reset to the first logical state,
wherein the second output signal has a first logical state indicative of granting the read or write access request and a second logical state indicative of granting the refresh access request to the memory cells of the PSRAM device.

12. The method of claim 11, wherein generating the delayed signal comprises:
generating the delayed signal having the leading signal transition being the leading signal transition of the first output signal delayed by the first delay and a trailing signal transition being the trailing signal transition of the first output signal without delay.

13. The method of claim 12, wherein generating the delayed signal comprises:
generating the delayed signal having no signal transition in response to the leading signal transition of the delayed signal occurring after the trailing signal transition.

14. The method of claim 12, wherein the leading signal transition of the delayed signal comprises a rising edge and the trailing signal transition of the delayed signal comprises a falling edge.

15. The method of claim 11, wherein the first delay is programmable to realize a given resolution time of the PSRAM device.

16. The method of claim 11, further comprising:
responsive to the second output signal being in the second logical state, resetting the second output signal to the first logical state after a first time duration.

17. The method of claim 16, wherein the first time duration comprises a time duration to complete a refresh operation of the memory cells in the PSRAM device.

18. The method of claim 11, further comprising:
providing the second output signal having the first logical state as a normal access grant signal to grant read or write operation access to the memory cells of the PSRAM device; and
providing the second output signal having the second logical state as a refresh access grant signal to grant refresh operation access to the memory cells of the PSRAM device.

19. The method of claim 11, wherein generating the first output signal comprises:
generating the first output signal using a NAND latch circuit including a pair of cross-coupled NAND logic gates, each NAND logic gate receiving respective first input signal and second input signal, the first output signal being an inverse of an output signal of the NAND logic gate receiving the second input signal.

20. The method of claim 11, wherein the normal access request signal indicative of the read or write access request to memory cells of the PSRAM device is derived from a signal external to the PSRAM device, and the refresh access request signal indicative of the refresh access request to memory cells of the PSRAM device is a signal generated within the PSRAM device.

* * * * *